(12) United States Patent  (10) Patent No.: US 6,492,827 B1
Mazur et al.  (45) Date of Patent: Dec. 10, 2002

(54) NON-INVASIVE ELECTRICAL MEASUREMENT OF SEMICONDUCTOR WAFERS

(75) Inventors: Robert G. Mazur, Sewickley, PA (US); Robert J. Hillard, Avalon, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 0 days.

(21) Appl. No.: 09/692,659

(22) Filed: Oct. 19, 2000

Related U.S. Application Data

(60) Provisional application No. 60/158,222, filed on Oct. 19, 1999.

(51) Int. Cl.[7] .............................................. G01R 31/02
(52) U.S. Cl. ...................................... 324/761; 324/754
(58) Field of Search ................................. 324/761–765, 324/754, 719, 662, 72.5, 690; 250/306, 307; 438/14, 17–18

(56) References Cited

U.S. PATENT DOCUMENTS

| | | | |
|---|---|---|---|
| 3,628,137 A | 12/1971 | Mazur | 324/64 |
| 3,995,216 A | 11/1976 | Yun | 324/158 R |
| 4,325,025 A | 4/1982 | Corcoran et al. | 324/158 R |
| 5,023,561 A | 6/1991 | Hillard | 324/719 |
| 5,485,097 A * | 1/1996 | Wang | 324/767 |
| 5,500,607 A | 3/1996 | Verkuil | 324/761 |
| 5,650,731 A | 7/1997 | Fung et al. | 324/752 |
| 5,723,981 A * | 3/1998 | Hellemans et al. | 324/719 |
| 5,767,691 A | 6/1998 | Verkuil | 324/761 |
| 5,872,017 A | 2/1999 | Boydston et al. | 438/17 |

OTHER PUBLICATIONS

Lederman, Albert entitled "Vacuum Operated Mercury Probe for CV Plotting and Profiling", MSI Electronics, Inc. Woodside, New York, Solid State Technology, Aug. 1981, pp. 123–126.

* cited by examiner

*Primary Examiner*—Vinh P. Nguyen
(74) *Attorney, Agent, or Firm*—Webb Ziesenheim Logsdon Orkin & Hanson, P.C.

(57) ABSTRACT

A semiconductor wafer probe assembly (10) includes a chuck assembly (18, 20) configured to receive a back surface (30) of a semiconductor wafer (14) and an electrical contact (20) for contacting the semiconductor wafer (14). A probe (36) having an elastically deformable conductive tip (38) is movable into contact with a semiconducting material forming a front surface (13) of the semiconductor wafer (14) or with a front surface (34) of a dielectric (12) formed on the front surface of the semiconducting material. A tester (82) is connected for applying an electrical stimulus between the electrical contact (20) and the conductive tip (38) for measuring a response to the electrical stimulus and for determining from the response at least one electrical property of the semiconducting material and/or the dielectric (12).

18 Claims, 3 Drawing Sheets

NON-INVASIVE ELECTRICAL MEASUREMENT OF SEMICONDUCTOR WAFERS

CROSS REFERENCE TO RELATED APPLICATION

This application claims priority from United States Provisional Patent Application Serial No. 60/158,222 which was filed on Oct. 19, 1999 entitled "Non-Invasive Measurement of Electrical Properties of a Dielectric Layer in a Semiconductor Wafer".

BACKGROUND OF THE INVENTION

1. Field of the Invention

This invention relates generally to an apparatus and method for measuring electrical properties of a semiconductor wafer.

2. Description of the Background Art

The determination of electrical properties of a dielectric on a semiconductor wafer and/or a carrier density profile within the semiconductor wafer is a critical factor in the production of such wafers. Measurements based on capacitance-voltage (CV) techniques, such as measurements of dielectric thickness, oxide charge, threshold voltage, implant dose and carrier profile, and measurements based on current-voltage (IV) techniques, such as dielectric leakage current and breakdown voltage, are typically accomplished by first fabricating metal or doped polysilicon gates on the dielectric. These gates become part of a metal oxide semiconductor (MOS) structure which is used to make the appropriate CV or IV measurement.

Fabrication of the metal or polysilicon gates is time-consuming and costly. It typically involves depositing and forming aluminum metal or polysilicon gates on the dielectric in a manner known in the art.

An alternative to these fabricated gates is described in an article entitled "Vacuum Operated Mercury Probe for CV Plotting and Profiling" by Albert Lederman, Solid State Technology, August 1981, pp. 123–126. This article discloses utilizing mercury contacts for replacing the aluminum or polysilicon gates in CV measurement techniques designed to characterize dielectric and semiconductor properties. The Lederman paper discloses a vacuum operated mercury probe for performing measurements of metal oxide semiconductors, homogeneous semiconductor wafers, non-homogeneous semiconductor wafers, and semiconductor wafers on insulating substrates. Problems may arise utilizing the Lederman mercury probe in that mercury may react chemically with the materials of the wafer under study. Mercury also poses a significant safety problem in its use and mercury sublimes at elevated temperatures when accelerated temperature testing of the semiconductor wafer is desired. Thus, a mercury probe has limited application.

An alternative to fabricated gates or vacuum operated mercury probes is disclosed in U.S. Pat. No. 5,023,561 to Hillard which issued on Jun. 11, 1991 and which is incorporated herein by reference.

The Hillard patent discloses a kinematic probe arm having at one end thereof a probe including a tip having a uniformly flat surface of predetermined dimensions. A probe stand supports the kinematic arm and a chuck supports the semiconductor wafer. The probe stand, the kinematic arm, and the chuck are configured so that a planar contact can be realized between the uniformly flat portion of the tip and the front surface of the dielectric layer of the semiconductor wafer.

When the Hillard patent was filed in the early 1990's, a typical gate oxide thickness in the semiconductor industry was on the order of hundreds of angstroms. The relatively small planar contact area between the uniformly flat tip of the probe and the outer surface of the dielectric layer on the wafer resulted in a poor capacitance signal-to-noise ratio when applied to these relatively thick oxides. Hence, while the probe having the uniformly flat tip could be utilized for performing CV measurements, this probe was preferably utilized to perform IV measurements.

In contrast, today, gate oxides are very thin, on the order of 3.5 nm. With these thin oxides, the capacitance signal-to-noise ratio is increased whereby CV measurements made with conductive pressure contacts can be effectively utilized to characterize gate oxides.

A problem with utilizing the probe disclosed in the Hillard patent for performing CV measurements is the need to grind the tip uniformly flat. Another problem is the need to establish a planar contact between the uniformly flat tip and the outer surface of the dielectric layer of the wafer. The use of a uniformly flat tip to form a planar contact within the outer surface of the dielectric layer is particularly a problem with today's thin oxide layers since a lack of perfect parallelism between the uniformly flat tip and the outer surface of the dielectric layer may result in an edge surrounding the uniformly flat tip damaging the oxide layer.

It is, therefore, an object of the present invention to avoid or overcome the above problems and others by providing a probe having an improved tip configuration that enables improved CV measurements of dielectric layers on a semiconductor wafer. Still other objects of the present invention will become apparent to those of ordinary skill in the art upon reading and understanding the following detailed description.

SUMMARY OF THE INVENTION

Accordingly, we have invented an apparatus for measuring at least one electrical property of a semiconductor wafer. The apparatus includes an assembly for supporting a semiconductor wafer and a probe having an elastically deformable conductive tip for contacting a front surface of the semiconductor wafer. The front surface of the semiconductor wafer can be (i) a dielectric formed on a front surface of semiconducting material which forms the semiconductor wafer or (ii) the semiconducting material. Also provided are an electrical contact for contacting the semiconductor wafer and a means for applying an electrical stimulus between the elastically deformable conductive tip and the electrical contact. A means is provided for measuring a response to the electrical stimulus and for determining from the response at least one electrical property of the dielectric and/or the semiconducting material.

The response to the electrical stimulus occurs at a boundary of the dielectric and the semiconducting material or in a region adjacent the front surface of the semiconducting material.

The dielectric includes at least one dielectric layer. The at least one dielectric layer can include a native dielectric layer which forms in response to exposure of the semiconducting material to air. Preferably, the conductive tip is formed from metal, such as tantalum, conductive elastomer, or conductive polymer.

A surface of the conductive tip for contacting the front surface of the semiconductor wafer has the form of a truncated sphere, e.g., a hemisphere, having a radius of curvature between 10 $\mu$m and 100 cm. When the conductive tip is in contact with the dielectric, an effective air gap is formed therebetween having an insulating value equivalent to an actual air gap of less than or equal to 1 nm, 0.8 nm, or 0.2 nm.

An electrically conductive sleeve can surround the probe and an insulator can be disposed between the probe and the sleeve. The sleeve can be connected to an electrical ground or can be connected to receive an electrical signal which biases the sleeve to the same potential as the conductive tip.

A kinematic probe arm assembly can be connected to the probe for controlling a force of the conductive tip on the front surface of the semiconductor wafer and the rate this force is applied to the front surface. The kinematic probe arm assembly can also avoid scrubbing of the elastically deformable conductive tip on the front surface of the semiconductor wafer when the tip moves into contact therewith.

We have also invented a semiconductor wafer probe assembly having a chuck assembly configured to receive a back surface of a semiconductor wafer and an electrical contact for contacting the semiconductor wafer. A probe is provided having an elastically deformable conductive tip which is movable into contact with (i) a front surface of a dielectric formed on a front surface of semiconducting material forming the semiconductor wafer or (ii) a front surface of the semiconducting material. A means is provided for applying an electrical stimulus between the electrical contact and the elastically deformable conductive tip, for measuring a response to the electrical stimulus, and for determining from the response at least one electrical property of the dielectric and/or the semiconducting material.

The electrical contact can contact the back surface of the semiconductor wafer or the front surface of the semiconducting material.

Lastly, we have invented a method of measuring at least one electrical property of a semiconductor wafer. The method includes providing a probe having an elastically deformable conductive tip and forming a first electrical contact between the tip and (i) a front surface of a dielectric formed on a front surface of semiconducting material forming the semiconductor wafer or (ii) a front surface of the semiconducting material. A second electrical contact is formed with the semiconductor wafer and an electrical stimulus is applied between the first electrical contact and the second electrical contact. A response to the electrical stimulus is measured and at least one electrical property of the dielectric and/or the semiconducting material is determined from the response.

A flow of inert gas can be supplied to a contact area between the conductive tip, the front surface of the dielectric layer, and the front surface of the semiconducting material.

DETAILED DESCRIPTION OF THE PREFERRED EMBODIMENT

Figure 2:
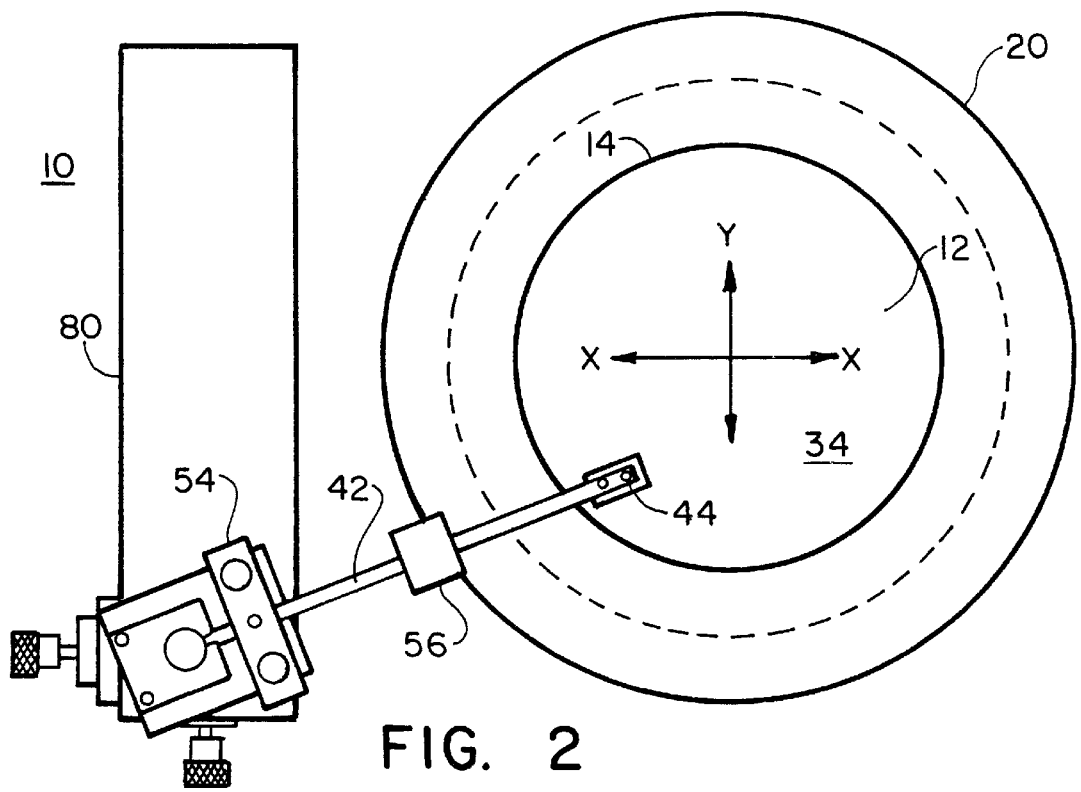
FIG. 2 is a plan view of the apparatus shown in FIG. 1.
Figure 1:
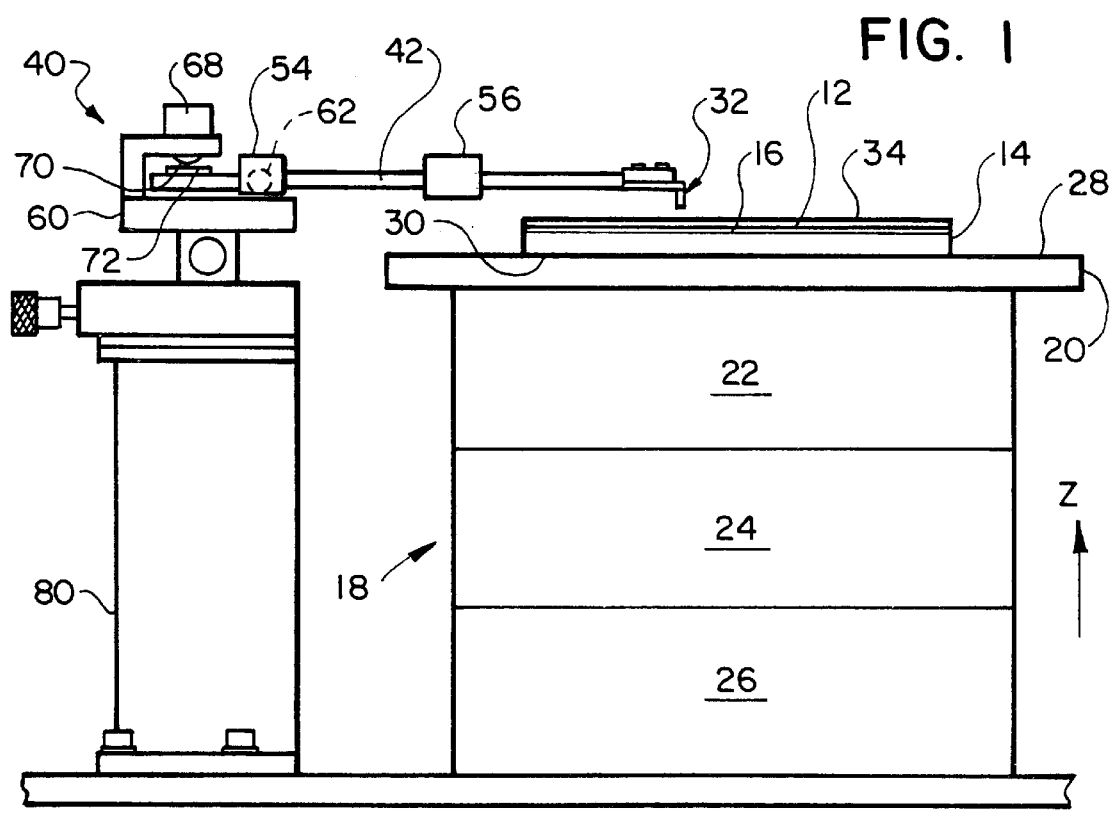
FIG. 1 is an elevational view, partially in section, of an apparatus of the present invention.
Figure 3:
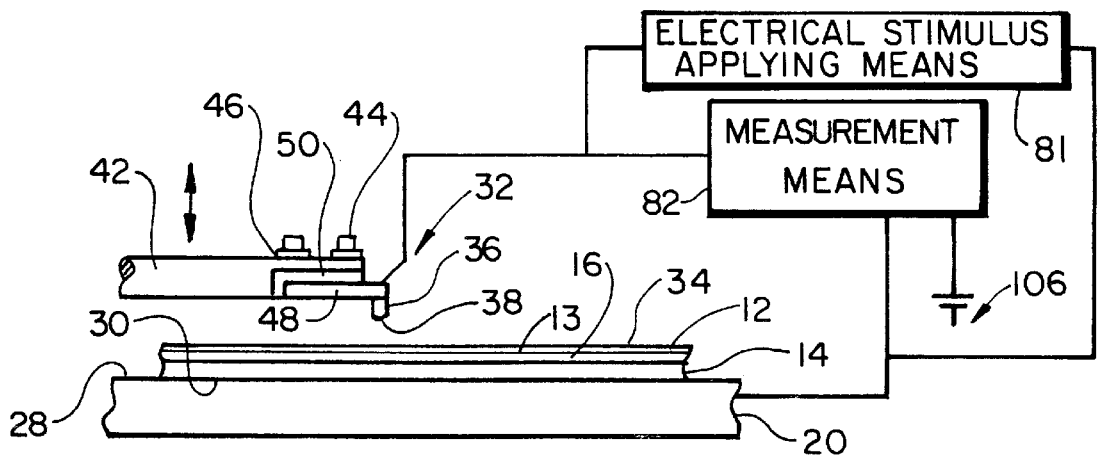
FIG. 3 is a schematic elevational sectional view of a probe in position above a semiconductor wafer to be tested in circuit with a measurement means.

Referring to FIGS. 1–3, an apparatus 10 for measuring electrical properties of a dielectric 12 on a front surface 13 of a semiconductor wafer 14 or in a region 16 of the semiconducting material adjacent the front surface 13 of the semiconductor wafer 14 includes a movable stage assembly 18. Movable stage assembly 18 includes a vacuum chuck 20 which holds semiconductor wafer 14 by means of vacuum. Preferably, movable stage assembly 18 includes a first or rotary stage 22 for rotating semiconductor wafer 14 in an X-Y plane, a second or Z stage 24 for adjusting the vertical position of semiconductor wafer 14, and a third or X/X-Y stage 26 for moving semiconductor wafer 14 in an X or X-Y direction, respectively.

Apparatus 10 includes a first electrical contact 32 for contacting an upper or front surface 34 of dielectric 12. First electrical contact 32 includes a conductive probe 36 preferably having a cylindrically-shaped stainless steel shank. Chuck 20 includes an upper or front surface 28 which defines a second electrical contact for contacting a back surface 30 of semiconductor wafer 14.

Figure 4:
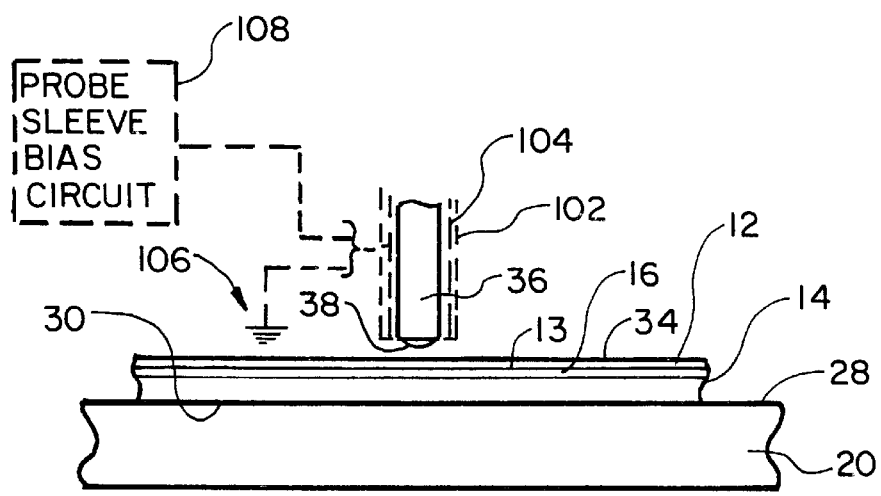
FIG. 4 is an enlarged elevational view of the probe tip shown in FIG. 3 in position above the semiconductor wafer to be tested.

With reference to FIG. 4, and with continuing reference to FIGS. 1–3, a distal end of conductive probe 36 includes a contact portion or tip 38 affixed thereto. A surface of tip 38 facing away from conductive probe 36 preferably has the form of a truncated sphere, e.g., a hemisphere, having a radius of curvature preferably between 10 $\mu$m and 100 cm. Tip 38 is formed from an elastically deformable and conductive material, such as a smooth highly polished metal, such as tantalum, a conductive elastomer, or a conductive polymer.

Apparatus 10 includes a kinematic probe arm assembly 40 having a probe arm 42 with conductive probe 36 affixed thereto by screws 44 and insulating washers 46. Conductive probe 36 is electrically connected to a conductive probe mount 48 which is isolated from probe arm 42 by an insulator 50 connected therebetween. Kinematic probe arm assembly 40 controls the rate of descent of conductive probe 36 and avoids tip 38 from scrubbing front surface 34 of dielectric 12 of semiconductor wafer 14 and causing damage to tip 38 or dielectric 12. Moreover, kinematic probe arm assembly 40 controls a force with which tip 38 is applied to front surface 34 of dielectric 12 and the rate this force is applied thereto.

With reference to FIGS. 5–8, and with ongoing reference to FIGS. 1–4, kinematic probe arm assembly 40 includes an assembly 54 for pivotally supporting probe arm 42 and a probe arm weight 56 slidably received on probe arm 42 for fixing a load on tip 38 of conductive probe 36, preferably between 5 and 200 grams. A lower-bearing plate 60 includes bearing balls 62 received in a V-groove 64 and a trihedral hollow 66 of assembly 54.

Figure 8:
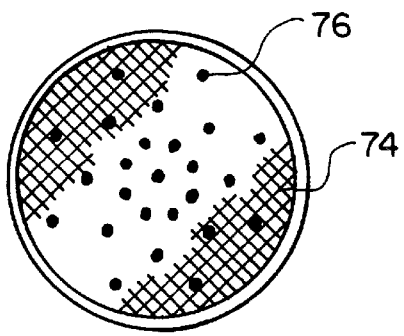
FIG. 8 is an enlarged view of a lifter pad wire mesh of the kinematically stable probe arm shown in FIG. 5.
Figure 5:
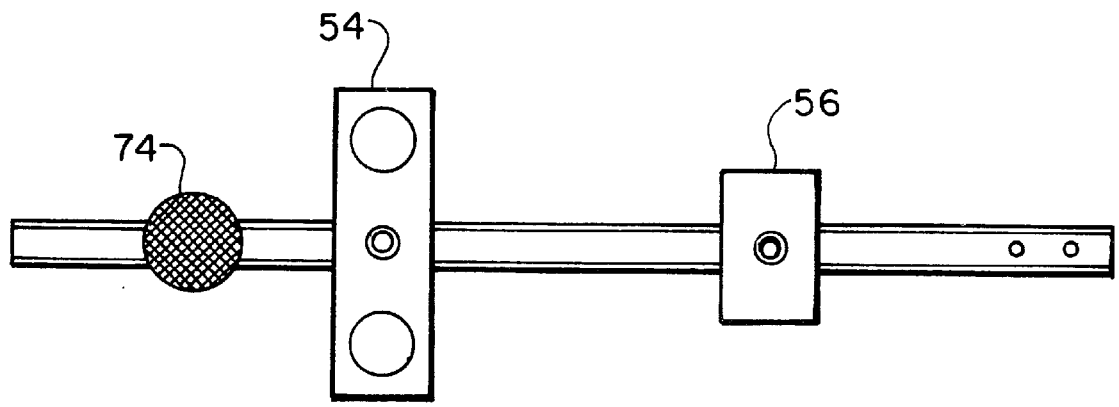
FIG. 5 is an isolated plan view of a kinematically stable probe arm of the apparatus shown in FIG. 2.
Figure 6:
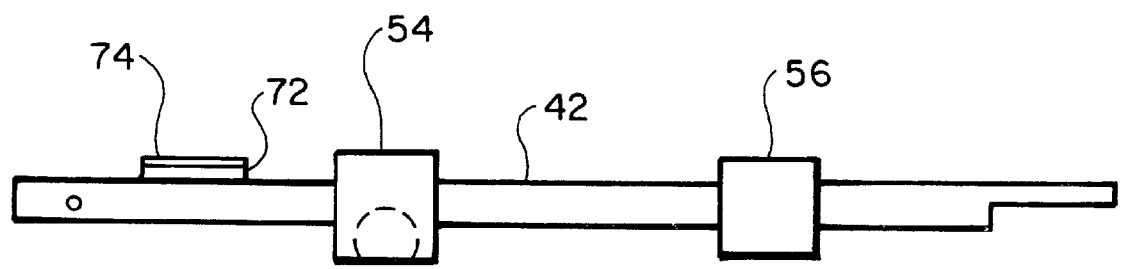
FIG. 6 is a side view of the kinematically stable probe arm shown in FIG. 5.
Figure 7:
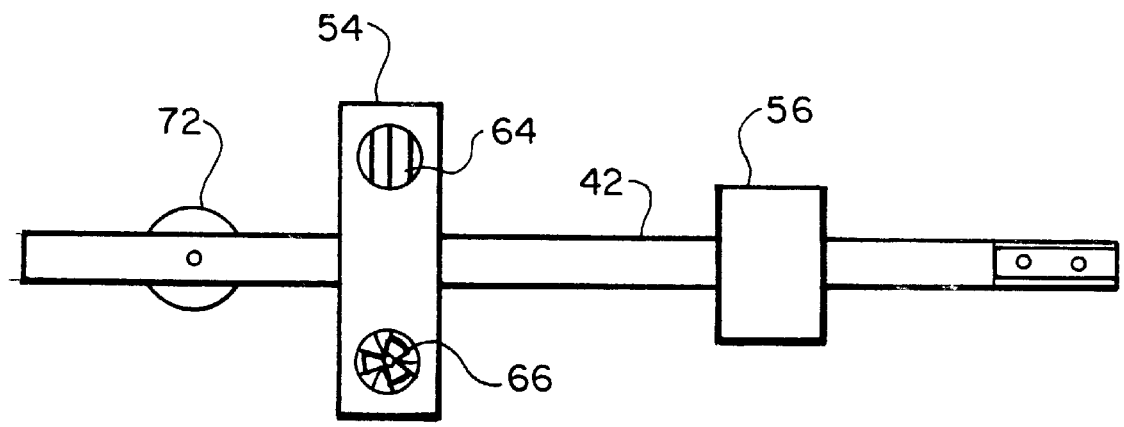
FIG. 7 is a bottom view of the kinematically stable probe arm shown in FIG. 5.

Probe arm 42 is raised and lowered by a pneumatic probe lift 68 which includes a rubber diaphragm 70 to contact an arm lifter pad 72 which is covered by a wire mesh 74, shown in FIGS. 5 and 8. Wire mesh 74 is held to arm lifter pad 72 by spot welds 76. To raise the end of probe arm 42 having conductive probe 36 thereon, air pressure inflates diaphragm 70 to contact wire mesh 74.

High quality contact formation between tip 38 and upper surface 34 of dielectric 12 is made by controlling the loading characteristics of probe arm 42, specifically by controlling the rate pneumatic probe lift 68 causes tip 38 of conductive probe 36 to apply pressure to upper surface 34 of dielectric 12. A probe stand 80 supports probe arm 42 at a desired position relative to semiconductor wafer 14.

In operation, semiconductor wafer 14 is received on vacuum chuck 20 and is held thereon by a vacuum. Upper surface 28 of vacuum chuck 20, which also functions as a first electrical contact, is connected in circuit with a measurement means 82, shown in FIG. 3. Z stage 24 is adjusted in a manner known in the art to move semiconductor wafer 14 vertically. X/X-Y stage 26 controls horizontal movement of semiconductor wafer 14 and rotary stage 22 controls rotational movement of semiconductor wafer 14 in a manner known in the art. Preferably, vacuum chuck 20 is electrically isolated from the remainder of movable stage assembly 18.

When back surface 30 of semiconductor wafer 14 is received on upper surface 28 of vacuum chuck 20, conductive probe 36 is kinematically controlled by kinematic probe arm assembly 40 to establish contact between tip 38 and upper surface 34 of dielectric 12. Measurement of one or more electrical properties of dielectric 12 and/or region 16 of the semiconducting material adjacent the front surface 13 of semiconductor wafer 14 is accomplished by an electrical stimulus applying means 81 applying an electrical stimulus, e.g., a high frequency AC voltage, or a high frequency AC voltage combined with a DC bias voltage (CV) or a DC stress voltage or current (IV), between first electrical contact 32 and the second electrical contact, i.e., upper surface 28 of chuck 20 and, more particularly, between back surface 30 of semiconductor wafer 14 and upper surface 34 of dielectric 12. Measurement means 82 then measures the response to the applied electrical stimulus and determines from the response one or more electrical properties of dielectric 12 and/or region 16 of the semiconducting material adjacent the front surface 13 of semiconductor wafer 14.

As discussed above, tip 38 is polished to a smooth surface. One preferred technique for polishing tip 38 is mechanical or metallographic polishing to shape and smooth tip 38. In this technique, the surface roughness of unpolished tip 38 is progressively decreased through a series of polishing steps, with each step utilizing a finer abrasive to create a smoother surface finish. More specifically, tip 38 is first shaped utilizing a fine hard-mounted abrasive, such as an adhesive-backed plastic film with abrasive particles cemented into it, that has been lubricated with a suitable lubricating fluid and mounted to a rotary polishing wheel. The polishing wheel is rotated at a constant speed and tip 38 is moved into contact with the abrasive film. Tip 38 is moved and rotated to create the desired radius of curvature. A pressure applied to tip 38 during polishing with the hard-mounted abrasive can be adjusted to avoid scratching, and tip 38 is kept in motion to avoid creating a "flat" thereon. This process is continued until the radius of curvature is acceptable. Next, a synthetic or natural polishing pad is mounted to a rotary polishing wheel and an abrasive slurry having abrasive particles suspended in a dispersion liquid is applied to the pad. Tip 38 is then brought into contact with the rotating slurry soaked polishing pad and moved thereon to provide a uniform consistent polish on the surface of tip 38. The foregoing polishing technique has been utilized successfully on tips 38 formed from different materials. However, different polishing techniques can also be utilized as necessary.

Regardless of how smooth tip 38 is polished, at the atomic level, the surface of tip 38 has ridges and valleys. In contrast, at the atomic level, upper surface 34 of dielectric 12 is locally essentially flat, i.e., atomically flat. Because of the interaction between the ridges and valleys of the surface of tip 38 and the essentially flat upper surface 34 of dielectric 12 when tip 38 is brought into contact with dielectric 12, the actual microscopic area of contact is less than the apparent macroscopic area of contact. More specifically, because of the interaction between the ridges and valleys of the surface of tip 38 and the essentially flat surface of dielectric 12, a plurality of microscopic contacts and a plurality of microscopic gaps form therebetween. The plurality of microscopic gaps coact to form an effective air gap between tip 38 and dielectric 12. This effective air gap along with tip 38, dielectric 12, semiconductor wafer 14, and chuck 20 coact to form a capacitor, with tip 38 defining one plate of the capacitor; a surface charge or a space charge on the front surface of the semiconducting material or in region 16 of the semiconducting material adjacent front surface 13 of the semiconductor wafer 14, respectively, defining the other plate of the capacitor; and with the effective air gap in series with dielectric 12 defining an insulator 50 between tip 38 and the charges on or in the semiconducting material.

Preferably, the insulating value of the effective air gap is equivalent to an actual air gap of 1 nm or less. This effective air gap between tip 38 and dielectric 12 can be utilized to quantify the extent to which the surface of tip 38 is polished smooth. Specifically, as discussed above, at the atomic level, upper surface 34 of dielectric 12 is essentially flat. Hence, changes in the extent of the effective air gap are based on the smoothness of the surface of tip 38. In accordance with the present invention, tip 38 is polished to a smoothness so that when tip 38 contacts upper surface 34 of dielectric 12, the effective air gap therebetween has an insulating value equivalent to an actual air gap of less than or equal to 1 nm, preferably less than or equal to 0.8 nm and, more preferably, less than or equal to 0.2 nm.

As previously discussed, electrical properties of dielectric layers, such as silicon dioxide thin films, are usually studied by using the film as the dielectric in a fabricated MOS gate. This approach is time-consuming because it requires additional processing to create the MOS gates as previously discussed. Utilizing conductive probe 36 with an elastically deformable conductive tip 38 in contact with dielectric 12, it is possible to characterize thin dielectric films, for example, $SiO_2$ on silicon, quickly by forming a temporary small area MOS diode where tip 38 is the metal gate, dielectric 12 is the oxide, and the semiconducting material forming semiconductor wafer 14 is the semiconductor.

Utilizing the present invention, CV measurements are also easily performed to determine mobile ion density. Unlike the fabrication of metals or polysilicon gates, no additional processing steps are required. Measurements can be made immediately following a critical process step, such as gate oxidation.

The use of kinematic probe arm assembly 40 to control conductive probe 36 eliminates scrubbing of dielectric 12 by tip 38. Moreover, the radius and elasticity of tip 38 avoids penetration thereof into dielectric 12 thereby allowing measurements to be made on thin oxides. The kinematic probe arm assembly 40 in combination with the radius and elasticity of tip 38 enables measurements of semiconducting wafer 14 without damaging or contaminating dielectric 12 or the underlying semiconducting material. Furthermore, kinematic probe arm assembly 40 enables more accurate positioning and placement of conductive probe 36 and ensures that the contact formed between dielectric 12 and tip 38 is repeatable.

Since tip 38 of conductive probe 36 is elastically deformable, the contact area between tip 38 and dielectric 12 can be adjusted within the elastic limits of tip 38 by varying the load applied to tip 38 by kinematic probe arm assembly 40.

The mechanical contact area between tip 38 of conductive probe 36 and dielectric 12 can be determined by the well-known Hertzian formula related to elastic contacts between spherical and flat bodies. The effective contact area between tip 38 and dielectric 12 is the sum of the mechanical contact portion and the region adjacent to the mechanical contact portion where capacitive coupling is significant to the CV measurement. Preferably, the radius and smoothness of tip 38 is selected to maximize the mechanical contact portion and the region of capacitive coupling between tip 38 and dielectric 12.

As discussed above, the thick dielectric layers on semiconductor wafers in the early 1990's necessitated the use of probes having uniformly flat tips of the type and size disclosed in the above-mentioned Hillard patent in order to attempt CV measurements with a sufficient signal-to-noise ratio to allow characterization of properties of the dielectric layer. To this end, the uniformly flat tip of the probe disclosed in the Hillard patent involved formation of a relatively large contact area. However, even these relatively large contact areas were insufficient for accurate CV measurements.

At the time of the Hillard patent, conductive probe 36 having tip 38 with the above-described radius would not have been considered for use in performing CV measurements due to its reduced contact area versus the contact area formed by the uniformly flat tip of the probe disclosed in the Hillard patent. Hence, it has only been with the recent introduction of relatively thin dielectrics on semiconductor wafers that the use of elastically deformable and conductive tip 38 having a hemispherical or truncated sphere shape could be considered or utilized for conducting CV measurements.

To improve measurement quality, a flow of dry gas can be directed to the contact area between tip 38 and upper surface 34 of dielectric 12 to eliminate moisture thereon. Preferably, the gas is an inert gas, such as nitrogen.

Sometimes it will be preferable to apply the electrical stimulus through a front contact to the semiconducting material instead of through back surface 30 of semiconductor wafer 14. In these cases, a second kinematic probe, similar to the above-described conductive probe 36, will make contact through a "window" in dielectric 12, thereby replacing the electrical functions of chuck 20.

Dielectric 12 can include one or more dielectric layers formed on the semiconducting material of semiconductor wafer 14 by processing steps during the fabrication of semiconductor wafer 14. Alternatively, dielectric 12 can include a native dielectric layer formed on the semiconducting material of semiconductor wafer 14 in response to exposure of the semiconducting material to air. Combinations of a native dielectric layer and one or more dielectric layers formed by processing steps are also contemplated.

It is well-known in the art that certain semiconducting materials do not facilitate the formation of a native dielectric layer thereon when exposed to air. Moreover, because of the application of these semiconducting materials, it is not desirable to form dielectrics thereon during processing of the semiconducting material. In accordance with the present invention, the elastically deformable conductive tip 38 of conductive probe 36 can be utilized to perform measurements of the electrical properties of such semiconductor wafers 14. Specifically, tip 38 of conductive probe 36 can be moved into contact with upper surface 34 of semiconductor wafer 14 to form a Schottky diode. Measurement of one or more electrical properties of semiconductor wafer 14 absent dielectric 12 can be accomplished by applying an electrical stimulus, e.g., a high frequency AC voltage, or a high frequency AC voltage combined with a DC bias voltage (CV) or a DC stress voltage or current (IV), between semiconductor wafer 14 and tip 38. Measurement procedures and analyses are straightforward and known in the art.

Preferably, the elastically deformable and conductive material forming tip 38 is selected based upon whether tip 38 is to contact dielectric 12 or is to contact surface 13 of semiconductor wafer 14. Specifically, if tip 38 is configured to contact front surface 34 of dielectric 12, tip 38 is formed from a material having a first contact potential work function. In contrast, tip 38 is formed from a material having a second contact potential work function when tip 38 is configured to contact front surface 13 of semiconductor wafer 14.

Lastly, conductive probe 36 can be received in an electrically conductive probe sleeve 102, shown in phantom in FIG. 4, and an insulator 104, also shown in phantom in FIG. 4, can be sandwiched between sleeve 102 and conductive probe 36. As shown in FIG. 4, probe sleeve 102 preferably extends along the length of conductive probe 36 and terminates before the distal end of tip 38. Sleeve 102 can be connected to an electrical ground 106 of measurement means 82 to shield conductive probe 36 from receiving electrical interference from external sources. Alternatively, sleeve 102 can be connected to an electrical signal chosen to minimize the effects of stray capacitance. More specifically, probe sleeve 102 can be connected to a bias circuit 108 which supplies to probe sleeve 102 an electrical signal which biases probe sleeve 102 to the same potential as tip 38 during application of the electrical stimulus between first electrical contact 32 and the second electrical contact defined by upper surface 28 of chuck 20.

The invention has been described with reference to the preferred embodiment. Obvious modifications and alterations will occur to others upon reading and understanding the preceding detailed description. It is intended that the invention be construed as including all such modifications and alterations insofar as they come within the scope of the appended claims or the equivalents thereof.

We claim:

1. An apparatus for measuring at least one electrical property of a semiconductor wafer, the apparatus comprising:

an assembly for supporting a semiconductor wafer;

a probe having an elastically deformable conductive tip for contacting a front surface of the semiconductor wafer, where the front surface is comprised of (i) a dielectric formed on a front surface of semiconducting material which forms the semiconductor wafer or (ii) the semiconducting material;

means for applying an electrical stimulus to the elastically deformable conductive tip; and means for measuring a response to the electrical stimulus and for determining from the response at least one electrical property of the dielectric and/or the semiconducting material, wherein, when the elastically deformable conductive tip contacts the semiconducting material, the applying means applies a capacitance-voltage (CV) or current-voltage (IV) type electrical stimulus and the measuring means measures the respective CV or IV response of the semiconducting material to the electrical stimulus.

2. The apparatus as set forth in claim 1, wherein the response to the electrical stimulus occurs at a boundary of the dielectric and the semiconducting material or adjacent the front surface of the semiconducting material.

3. The apparatus as set forth in claim 1, wherein the dielectric includes at least one dielectric layer.

4. The apparatus as set forth in claim 3, wherein the at least one dielectric layer includes a native dielectric layer which forms in response to exposure of the semiconducting material to air.

5. The apparatus as set forth in claim 1, wherein the conductive tip is formed from metal, conductive elastomer, or conductive polymer.

6. The apparatus as set forth in claim 1, wherein a surface of the conductive tip for contacting the front surface of the semiconductor wafer has the form of a truncated sphere having a radius of curvature between 10 $\mu$m and 100 cm.

7. The apparatus as set forth in claim 1, wherein when the conductive tip is in contact with the dielectric, an effective air gap is formed therebetween having an insulating value equivalent to an actual air gap of less than or equal to (i) 1 nm, (ii) 0.8 nm, or (iii) 0.2 nm.

8. The apparatus as set forth in claim 1, further including:
an electrically conductive sleeve surrounding the probe; and
an insulator between the probe and the sleeve, wherein the sleeve is connected (i) to an electrical ground or (ii) to receive an electrical signal which biases the sleeve to the same potential as the conductive tip.

9. The apparatus as set forth in claim 1, further including a kinematic probe arm assembly connected to the probe for:
(i) controlling a force of the conductive tip on the front surface of the semiconductor wafer and the rate this force is applied to the front surface; and/or
(ii) avoiding scrubbing of the elastically deformable conductive tip on the front surface of the semiconductor wafer when the tip moves into contact therewith.

10. A semiconductor wafer probe assembly comprising:
a chuck assembly configured to receive a back surface of a semiconductor wafer;
a probe having an elastically deformable conductive tip which is movable into contact with (i) a front surface of a dielectric formed on a front surface of semiconducting material forming the semiconductor wafer or (ii) a front surface of the semiconducting material, and
means for applying an electrical stimulus to the elastically deformable conductive tip, for measuring a response to the electrical stimulus, and for determining from the response at least one electrical property of the dielectric and/or the semiconducting material, wherein, when the elastically deformable conductive tip contacts the semiconducting material, said means applies a capacitance-voltage (CV) or current-voltage (IV) type electrical stimulus and measures the respective CV or IV response of the semiconducting material to the electrical stimulus.

11. The apparatus as set forth in claim 10, wherein the response of the semiconductor wafer to the electrical stimulus occurs at a boundary of the dielectric and the semiconducting material or in a region of the semiconducting material adjacent the front surface thereof.

12. The apparatus as set forth in claim 10, wherein the conductive tip is polished so that when it and the dielectric are in contact an effective air gap is formed therebetween which has an insulating value equivalent to an actual air gap between 1 nm and 0.2 nm.

13. The apparatus as set forth in claim 10, further including:
an electrically conductive sleeve surrounding the probe; and
an insulator between the probe and the sleeve.

14. A method of measuring at least one electrical property of a semiconductor wafer, the method comprising the steps of:
(a) providing a probe having an elastically deformable conductive tip;
(b) forming a first electrical contact between the tip and (i) a front surface of a dielectric formed on a front surface of semiconducting material forming the semiconductor wafer or (ii) a front surface of the semiconducting material;
(c) forming a second electrical contact with the semiconductor wafer;
(d) applying an electrical stimulus between the first electrical contact and the second electrical contact;
(e) measuring a response to the electrical stimulus; and
(f) determining from the response at least one electrical property of the dielectric and/or the semiconducting material.

15. The method as set forth in claim 14, further including at least one of the steps of:
forming the conductive tip into a truncated sphere; and
polishing a surface of the conductive tip so that when it is in contact with the dielectric an effective air gap is formed therebetween which has an insulating value equivalent to an actual air gap of no more than 1 nm.

16. The method as set forth in claim 15, wherein the conductive tip is formed from metal, conductive elastomer, or conductive polymer.

17. The method as set forth in claim 14, further including the step of supplying a flow of inert gas to a contact area between the conductive tip, the front surface of the dielectric, and the front surface of the semiconducting material.

18. The method as set forth in claim 14, wherein the second electrical contact is formed with (i) a back surface of the semiconductor wafer or (ii) the front surface of the semiconducting material.

* * * * *